United States Patent
Yun et al.

(10) Patent No.: US 10,069,474 B2
(45) Date of Patent: Sep. 4, 2018

(54) ENCAPSULATION OF ACOUSTIC RESONATOR DEVICES

(71) Applicant: QUALCOMM Incorporated, San Diego, CA (US)

(72) Inventors: Changhan Hobie Yun, San Diego, CA (US); Chengjie Zuo, San Diego, CA (US); Daeik Daniel Kim, Del Mar, CA (US); Mario Francisco Velez, San Diego, CA (US); Niranjan Sunil Mudakatte, San Diego, CA (US); Je-Hsiung Jeffrey Lan, San Diego, CA (US); David Francis Berdy, San Diego, CA (US); Yunfei Ma, Santa Clara, CA (US); Robert Paul Mikulka, Oceanside, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 230 days.

(21) Appl. No.: 15/137,662

(22) Filed: Apr. 25, 2016

(65) Prior Publication Data

US 2017/0141756 A1     May 18, 2017

Related U.S. Application Data

(60) Provisional application No. 62/256,246, filed on Nov. 17, 2015.

(51) Int. Cl.
*H03H 9/05*     (2006.01)
*H03H 9/10*     (2006.01)
(Continued)

(52) U.S. Cl.
CPC .............. *H03H 9/542* (2013.01); *H03H 3/02* (2013.01); *H03H 3/08* (2013.01); *H03H 9/0547* (2013.01);
(Continued)

(58) Field of Classification Search
CPC ...... H03H 3/02; H03H 3/08; H03H 2003/021; H03H 9/0547; H03H 9/0557;
(Continued)

(56) References Cited

U.S. PATENT DOCUMENTS

| | | | |
|---|---|---|---|
| 6,710,681 B2 | 3/2004 | Figueredo et al. | |
| 6,768,396 B2 * | 7/2004 | Klee | H03H 3/02 333/187 |

(Continued)

FOREIGN PATENT DOCUMENTS

| | | | |
|---|---|---|---|
| JP | 9-093077 A | * | 4/1997 |
| JP | 2003-008394 A | * | 1/2003 |

(Continued)

OTHER PUBLICATIONS

English language machine translation of JP 2009-010121, published Jan. 15, 2009, 10 pages.*

(Continued)

*Primary Examiner* — Barbara Summons
(74) *Attorney, Agent, or Firm* — Qualcomm Incorporated-Toler

(57) ABSTRACT

A device includes an acoustic resonator embedded within an encapsulating structure that at least partially encapsulates the acoustic resonator. The device includes an inductor electrically connected to the acoustic resonator. At least a portion of the inductor is embedded in the encapsulating structure.

30 Claims, 13 Drawing Sheets

(51) Int. Cl.

| | | |
|---|---|---|
| *H03H 9/15* | (2006.01) | |
| *H03H 3/02* | (2006.01) | |
| *H01F 17/02* | (2006.01) | |
| *H05K 1/18* | (2006.01) | |
| *H03H 9/54* | (2006.01) | |
| *H05K 3/46* | (2006.01) | |
| *H05K 1/03* | (2006.01) | |
| *H05K 3/00* | (2006.01) | |
| *H03H 3/08* | (2006.01) | |
| *H03H 9/64* | (2006.01) | |
| *H01F 17/00* | (2006.01) | |
| *H03H 7/01* | (2006.01) | |
| *H03H 7/46* | (2006.01) | |

(52) U.S. Cl.
CPC ........ *H03H 9/0557* (2013.01); *H03H 9/0561* (2013.01); *H03H 9/1014* (2013.01); *H03H 9/1071* (2013.01); *H03H 9/64* (2013.01); *H05K 1/0306* (2013.01); *H05K 1/185* (2013.01); *H05K 3/0014* (2013.01); *H05K 3/4602* (2013.01); *H01F 17/0013* (2013.01); *H01F 2017/002* (2013.01); *H01F 2017/0026* (2013.01); *H03H 7/0123* (2013.01); *H03H 7/461* (2013.01)

(58) Field of Classification Search
CPC .. H03H 9/0561; H03H 9/0595; H03H 9/1014; H03H 9/1035; H03H 9/1042; H03H 9/105; H03H 9/1071; H03H 9/1085; H03H 9/1092; H03H 9/542; H03H 9/64; H03H 7/0123; H03H 7/461; H05K 1/0213; H05K 1/0298; H05K 1/0306; H05K 1/14; H05K 1/16; H05K 1/162; H05K 1/165; H05K 1/182; H05K 1/185; H05K 3/0014; H05K 3/4602; H05K 3/4605; H01F 17/0013; H01F 2017/002; H01F 2017/0026
USPC ................ 333/133, 186, 187, 189, 193, 195
See application file for complete search history.

(56) References Cited

U.S. PATENT DOCUMENTS

| | | | | |
|---|---|---|---|---|
| 6,784,765 B2* | 8/2004 | Yamada | ............... | H01L 23/5385 257/700 |
| 6,839,946 B2* | 1/2005 | Ylilammi | ................. | H03H 3/02 29/25.35 |
| 7,230,512 B1 | 6/2007 | Carpenter et al. | | |
| 7,332,986 B2* | 2/2008 | Koga | .................... | H03H 9/0576 310/313 B |
| 7,427,824 B2* | 9/2008 | Iwamoto | .............. | H03H 9/0576 310/313 R |
| 7,501,912 B2 | 3/2009 | Jamneala et al. | | |
| 7,596,849 B1* | 10/2009 | Carpenter | ............ | H03H 9/0547 29/592.1 |
| 8,123,966 B2* | 2/2012 | Kubo | ....................... | H03H 3/02 216/18 |
| 2003/0030994 A1 | 2/2003 | Takaya et al. | | |
| 2004/0189146 A1 | 9/2004 | Ueda et al. | | |
| 2006/0066419 A1 | 3/2006 | Iwaki et al. | | |
| 2009/0166068 A1 | 7/2009 | Takahashi et al. | | |
| 2009/0219670 A1 | 9/2009 | Takahashi et al. | | |
| 2011/0128092 A1* | 6/2011 | Fritz | ...................... | H03H 9/706 333/133 |
| 2011/0221546 A1* | 9/2011 | Yamaji | ................. | H03H 9/1071 333/193 |
| 2012/0119847 A1 | 5/2012 | Iwaki et al. | | |
| 2012/0280768 A1 | 11/2012 | Nakayama et al. | | |
| 2013/0207745 A1 | 8/2013 | Yun et al. | | |
| 2014/0104288 A1 | 4/2014 | Shenoy et al. | | |
| 2014/0118084 A1* | 5/2014 | Takemura | ............ | H03H 9/0576 333/133 |
| 2014/0184358 A1 | 7/2014 | Maurer | | |
| 2014/0197902 A1 | 7/2014 | Zuo et al. | | |
| 2014/0354114 A1* | 12/2014 | Moriya | ................. | B06B 1/0662 310/334 |
| 2015/0070107 A1* | 3/2015 | Tokuda | ............... | H03H 7/0115 333/195 |
| 2015/0280297 A1 | 10/2015 | Cao et al. | | |
| 2016/0322952 A1 | 11/2016 | Iizuka et al. | | |

FOREIGN PATENT DOCUMENTS

| | | | |
|---|---|---|---|
| JP | 2004-350255 A | * | 12/2004 |
| JP | 2009-010121 A | * | 1/2009 |
| WO | 2015093300 A1 | | 6/2015 |

OTHER PUBLICATIONS

English language machine translation of JP 2004-350255, published Dec. 9, 2004, 10 pages.*
Partial International Search Report—PCT/US2016/059853—ISA/EPO—dated Jan. 27, 2017.
International Search Report and Written Opinion—PCT/US2016/059853—ISA/EPO—dated May 8, 2017.

* cited by examiner

“ENCAPSULATION OF ACOUSTIC RESONATOR DEVICES

I. CROSS-REFERENCE TO RELATED APPLICATIONS

The present application claims priority from U.S. Provisional Patent Application No. 62/256,246, filed Nov. 17, 2015, entitled "ACOUSTIC RESONATOR DEVICES," which is incorporated by reference in its entirety.

II. FIELD

The present disclosure is generally related to acoustic resonator devices.

III. DESCRIPTION OF RELATED ART

Advances in technology have resulted in smaller and more powerful computing devices. For example, a variety of portable personal computing devices, including wireless telephones such as mobile and smart phones, tablets and laptop computers, are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Many of these devices include radio frequency (RF) communication circuitry to transmit and receive signals. The RF communication circuitry often includes a filter (e.g., a bandpass filter) and a passive network (e.g., a matching network or filter). The filter and the components of the passive network are generally coupled via traces on a circuit board, leading to a relatively large circuit board.

IV. SUMMARY

Components of acoustic filters (e.g., acoustic resonators) may be formed on the same chip or die as one or more components (e.g., capacitors or inductors) of a passive network (e.g., a matching network). The acoustic filters and passive network may be part of an RF communication circuit.

In a particular aspect, the device includes an acoustic resonator. The acoustic is embedded within an encapsulating structure that at least partially encapsulates the acoustic resonator. The device includes an inductor electrically connected to the acoustic resonator. At least a portion of the inductor is embedded within the encapsulating structure.

In a particular aspect, the device includes an inductor that includes a plurality of coils. The device includes an acoustic resonator disposed at least partially within a region bounded by at least one coil of the plurality of coils.

In a particular aspect, a method of fabricating a device is disclosed. The method includes forming at least a portion of an inductor on an encapsulating structure that encloses an acoustic resonator. The method further includes electrically connecting the inductor to the acoustic resonator.

One particular advantage provided by at least one of the disclosed aspects is that smaller RF circuitry may be formed since components of acoustic filters (e.g., acoustic resonators) can be on the same chip or die as components of passive devices (e.g., inductors or capacitors of passive networks). Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
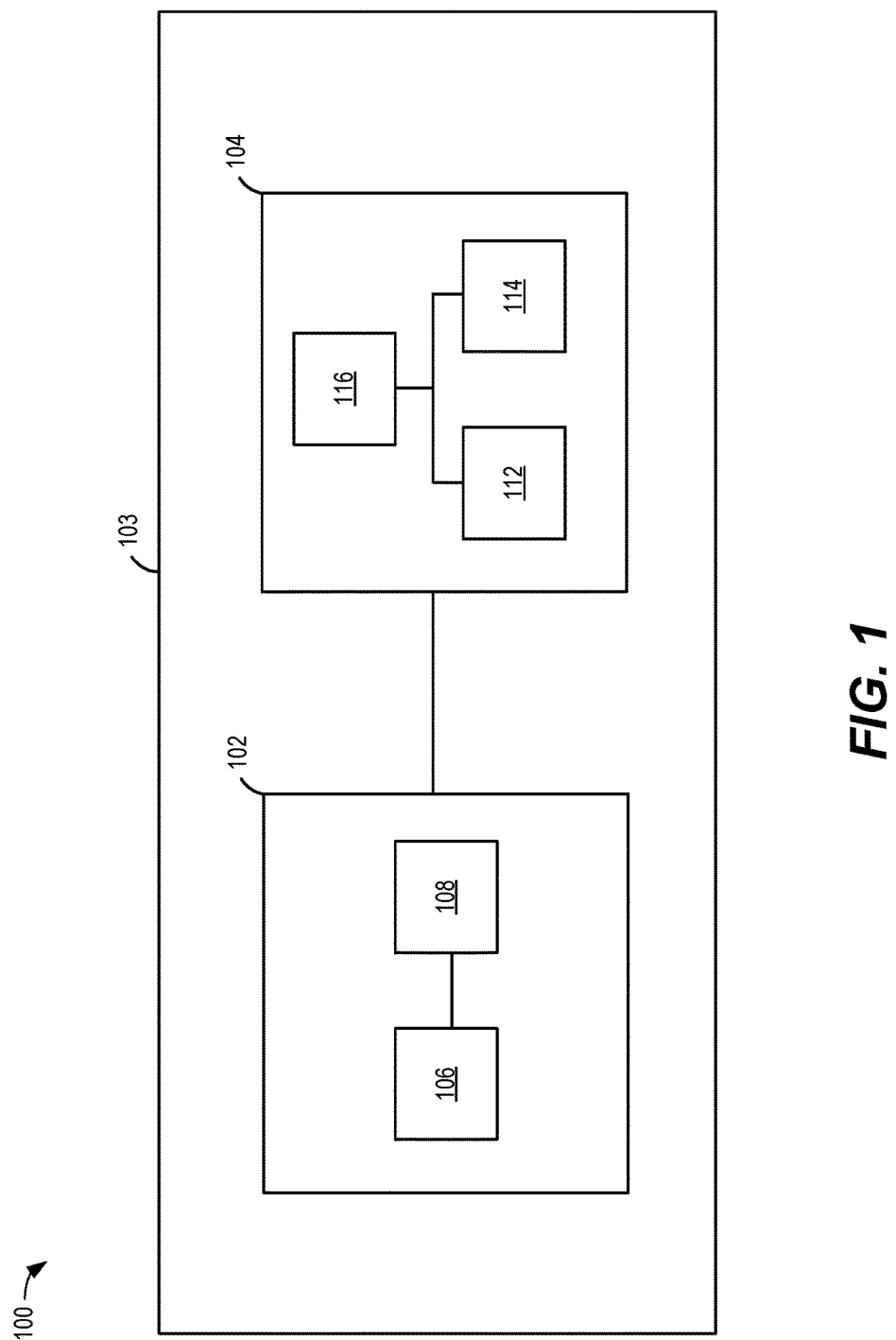
FIG. 1 illustrates a block diagram of an example of a first filter and a second filter formed on a single die.

Referring to FIG. 1, a particular illustrative device including a first filter 102 and a second filter 104 formed on a die 103 (e.g., a semiconductor die) is illustrated and depicted as 100. The first filter 102 may include or may correspond to an acoustic filter. In this example, the first filter 102 includes at least one acoustic resonator. For example, the first filter 102 may include an acoustic resonator 106 coupled to one or more other acoustic resonators 108. For example, the acoustic resonator 106 may be coupled to the one or more other acoustic resonators 108 in a ladder or lattice configuration to form the acoustic filter. In these examples, the acoustic filter may correspond to or may include an acoustic bandpass filter. In some examples, the first filter 102 may include or may correspond to a bandpass filter (e.g., an acoustic bandpass filter) of a radio frequency (RF) multiplexer (e.g., a duplexer).

The second filter 104 may be coupled to the first filter 102. For example, the second filter 104 may include one or more passive networks including an inductor 112 and a capacitor 114. The one or more passive networks may include other electrical components 116. The one or more passive networks may be configured to function as an LC filter (e.g., a wideband LC filter). For example, the acoustic resonator 106 may be electrically connected to the one or more other acoustic resonators 108 to form an acoustic bandpass filter of a duplexer, and the one or more passive networks including the inductor 112 and the capacitor 114 may, alone or in conjunction with the other electrical components 116, correspond to a phase shifter coupled to a port of the acoustic bandpass filter to filter one or more signals input or output at the port.

Thus, the device 100 of FIG. 1 includes an acoustic filter and a passive network filter (e.g., an LC filter) formed on a single die 103. Additionally, in some examples, the acoustic filter and the passive network filter may be part of a multiplexer (e.g., a multiple band multiplexer).

Figure 2A:
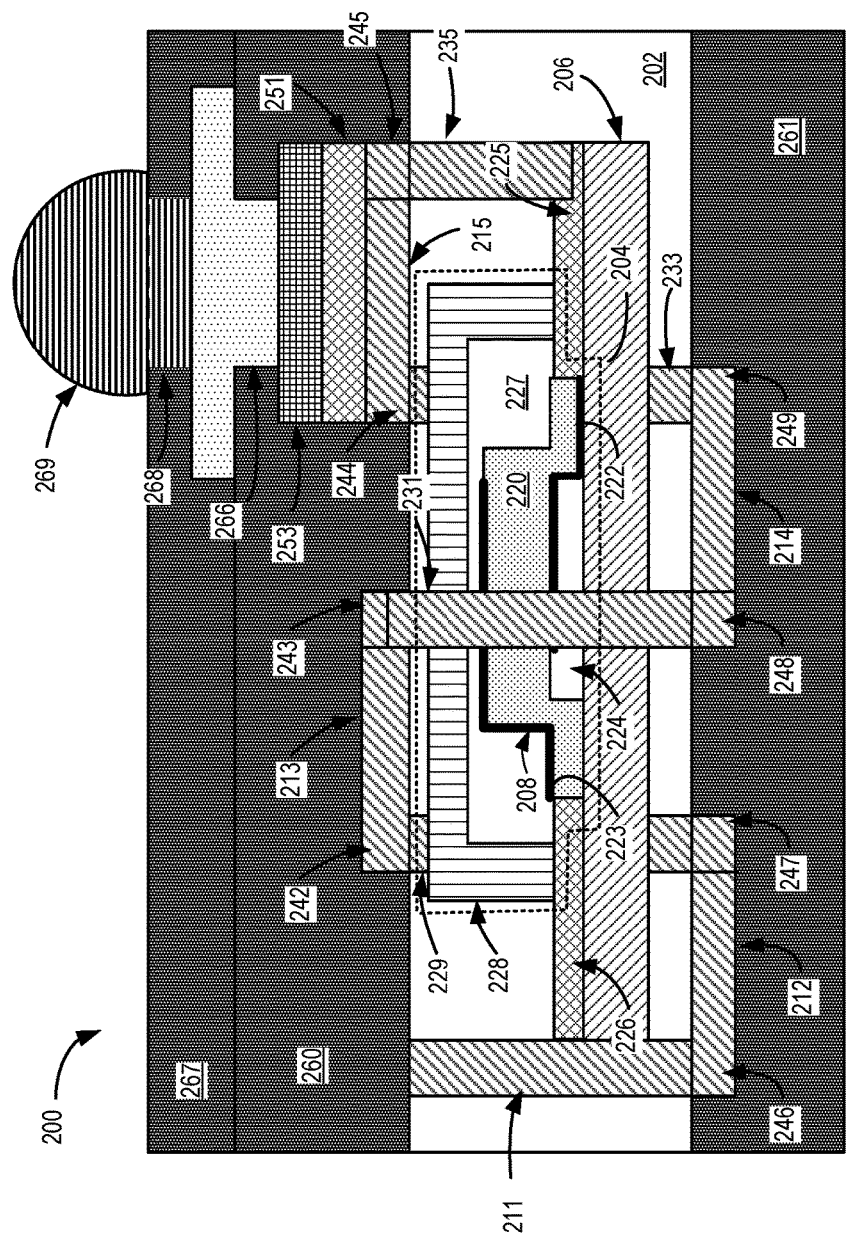
FIG. 2A illustrates a side view of an example of a device that includes an acoustic resonator embedded within a substrate.
Figure 2B:
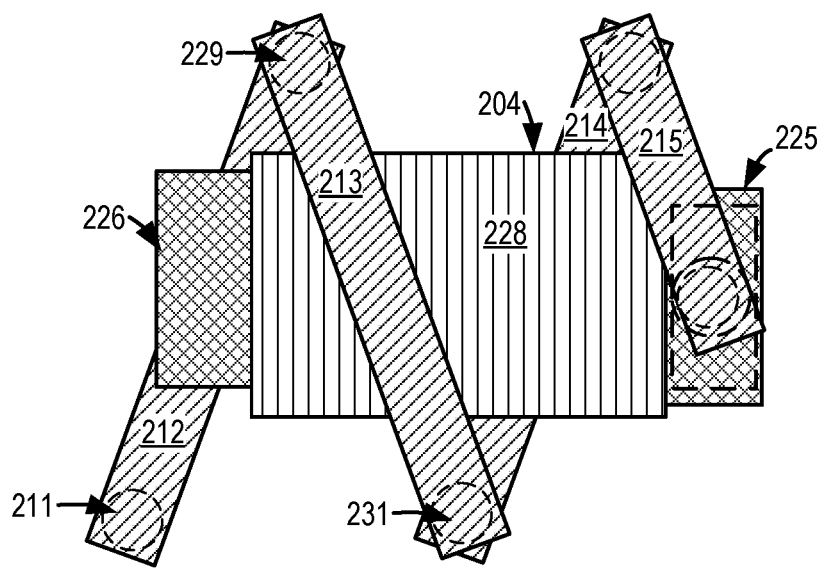
FIG. 2B illustrates a top down view of part of the device of FIG. 2A.
Figure 2C:
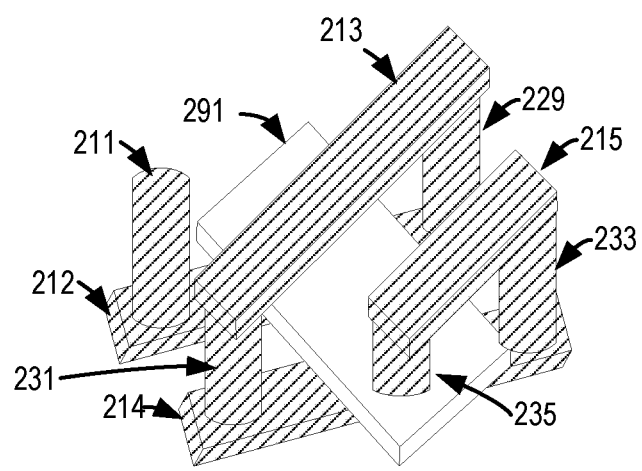
FIG. 2C illustrates a perspective view of part of the device of FIG. 2A.

Referring to FIG. 2A, a particular illustrative example of a device including a substrate 202 (e.g., an encapsulating structure) and an acoustic resonator 204 (or acoustic filter) embedded within the substrate 202 is disclosed and generally designated 200. FIG. 2B illustrates a top-down view of the substrate 202, an inductor, a capping layer 228 (of the acoustic resonator 204), and interconnects 225 and 226, of the device 200 of FIG. 2A. FIG. 2C illustrates a perspective view of the acoustic resonator 204 and the interconnects 225 and 226 (the acoustic resonator 204 and the interconnects 225 and 226 illustrated collectively as a block 291) of the device 200 of FIG. 2A at least partially disposed within a region bounded (e.g., encoiled) by at least one coil of the inductor of the device 200 of FIG. 2A.

The substrate 202 (e.g., a glass substrate) may be formed of or may include a glass material, a polymer material, or a combination thereof. The substrate 202 may enclose the acoustic resonator 204. The acoustic resonator 204 may correspond to or may include a surface acoustic wave (SAW) resonator, a bulk acoustic wave (BAW) resonator, or a thin-film bulk acoustic resonator (FBAR). For example, with reference to FIG. 2A, the acoustic resonator 204 may include or may correspond to an FBAR, and the acoustic resonator 204 may include a piezoelectric layer 220 between electrodes 222 and 223. The FBAR may be formed as described in more detail with reference to FIG. 3. As another example, the acoustic resonator 204 may correspond to a SAW resonator and may include a piezoelectric layer and inter digital transducers (IDTs).

In some examples, the acoustic resonator 204 may correspond to an acoustic filter. The acoustic resonator 204 may correspond to the acoustic resonator 106 of the first filter 102 of FIG. 1. Alternatively or additionally, in some examples, the acoustic resonator 204 may be electrically coupled to one or more other acoustic resonators (e.g., in a ladder or lattice configuration) to form an acoustic filter as described above.

With reference to FIG. 2A, the acoustic resonator 204 may include a resonator structure 208 that may be embedded within the substrate 202. The resonator structure 208 may be located proximate to (e.g., on, above, or over) a second substrate 206 that may be embedded within the substrate 202. The acoustic resonator 204 may include a capping layer 228 that may be embedded within the substrate 202 and that may define a cavity in which the resonator structure 208 is configured to vibrate in response to application of an electrical signal to one or more electrodes (e.g., one or more of the electrodes 222 and 223). In some examples, the capping layer 228 may partially define a cavity that includes air-gaps 224 and 227. The air-gaps 224 and 227 may confine acoustic waves to the piezoelectric layer 220. In some examples, the capping layer 228 may be formed of silicon, glass, a polymer, or a combination thereof, and may be disposed between the acoustic resonator 204 and the substrate 202. Although the acoustic resonator 204 is illustrated as, and described with reference to, an FBAR, the acoustic resonator 204 may include or may correspond to a SAW resonator or to a BAW resonator.

The device 200 may further include an inductor (e.g., at least one component of a passive network). For example, the inductor may correspond to or may include a plurality of coils (illustrated using a top-right to bottom-left diagonal fill pattern). The inductor may correspond to the inductor 112 of the second filter 104 of FIG. 1. The plurality of coils may be formed of or may include vias (e.g., a plurality of conductive vias) 211, 229, 231, 233, and 235 (e.g., through-glass vias) and interconnects 212, 213, 214, and 215. The vias 211, 229, 231, 233, and 235 may be disposed through or may be in the substrate 202, and the interconnects 212, 213, 214, and 215 may be alternatingly disposed on opposing surfaces of the substrate 202. Thus, at least a portion of the inductor (e.g., the vias 211, 229, 231, 233, and 235) may be embedded within the substrate 202. The interconnect 213 may include a first end 242 electrically coupled to a first end of the via 229 and may include a second end 243 coupled to a first end of the via 231. The interconnect 215 may include a first end 244 electrically coupled to a first end of the via 233 and may include a second end 245 coupled to a first end of the via 235. The interconnect 212 may include a first end 246 electrically coupled to a second end of the via 211 and may include a second end 247 coupled to a second end of the via 229. The interconnect 214 may include a first end 248 electrically coupled to a second end of the via 231 and may include a second end 249 coupled to a second end of the via 233. The inductor may be electrically connected to, or may include, the via 235, which may be electrically connected to the interconnect 225, and the interconnect 225 may be electrically connected to the electrode 222. Thus, the inductor may be electrically connected to the acoustic resonator 204 (e.g., to the electrode 222 of the acoustic resonator 204) via the via 235 and the interconnect 225. In some examples, the acoustic resonator 204 may be disposed at least partially within a region bounded (e.g., encoiled) by at least one coil of the plurality of coils.

The device 200 may further include a capacitor. In some examples, the capacitor may correspond to or may include a metal-insulator-metal (MIM) capacitor. To illustrate, the capacitor may include a conductive layer, such as the interconnect 215 formed on the substrate 202, a dielectric layer 251 formed on the interconnect 215, and a conductive layer 253 formed on the dielectric layer 251. The capacitor may be electrically connected to the via 235, which may be electrically connected to the interconnect 225, and the interconnect 225 may be electrically connected to the electrode 222. Thus, at least a portion of the capacitor may be disposed on the substrate 202 and may be electrically connected to the acoustic resonator 204 and to the inductor.

The device 200 may further include at least a portion of a passive network electrically coupled to the acoustic resonator 204. For example, the passive network may correspond to or may include one or more capacitors including the MIM capacitor described above and one or more inductors including the inductor described above. Thus, at least a portion of at least one component of the passive network (e.g., at least a portion of the inductor described above) may be embedded within the substrate 202. The passive network may be configured to function as an LC filter (e.g., a wideband LC filter) or as a phase shifter. For example, the acoustic resonator 204 may be electrically connected to one or more other acoustic resonators to form an acoustic bandpass filter of a duplexer as described above, and the passive network including the capacitor and the inductor of FIG. 2A described above may, alone or in conjunction with other electrical components, correspond to a phase shifter coupled to a port of the acoustic bandpass filter to filter one or more signals input or output at the port.

The device 200 may include an inter-layer dielectric (ILD) layer 260 on a first surface of the substrate 202. The ILD layer 260 may be formed of or may include one or more dielectric materials. The ILD layer 260 may include a laminate and may be deposited using a lamination process. The device 200 may include an ILD layer 261 on a second surface of the substrate 202. The ILD layer 261 may be formed of or may include one or more dielectric materials. The ILD layer 261 may include a laminate and may be deposited using a lamination process. The device 200 may further include a conductive (e.g., metal) layer 266. The device 200 may further include a passivation layer 267 on the ILD layer 260 and on the conductive layer 266. The device 200 may further include a soldering or bond pad 268 and a solder ball 269 attached to the soldering or bond pad 268.

Thus, the acoustic resonator 204 (e.g., an acoustic filter or a portion thereof) may be disposed within a region defined by coils of an inductor of a passive network to which the acoustic resonator 204 is electrically coupled. Positioning the acoustic resonator 204 within the region defined by the coils may reduce chip area occupied by the acoustic resonator 204 (e.g., acoustic filter) and the inductor (e.g., the passive network) as compared to devices in which the acoustic resonator 204 is formed in a different region (or on a different chip) than the inductor (of the passive network).

Figure 3:
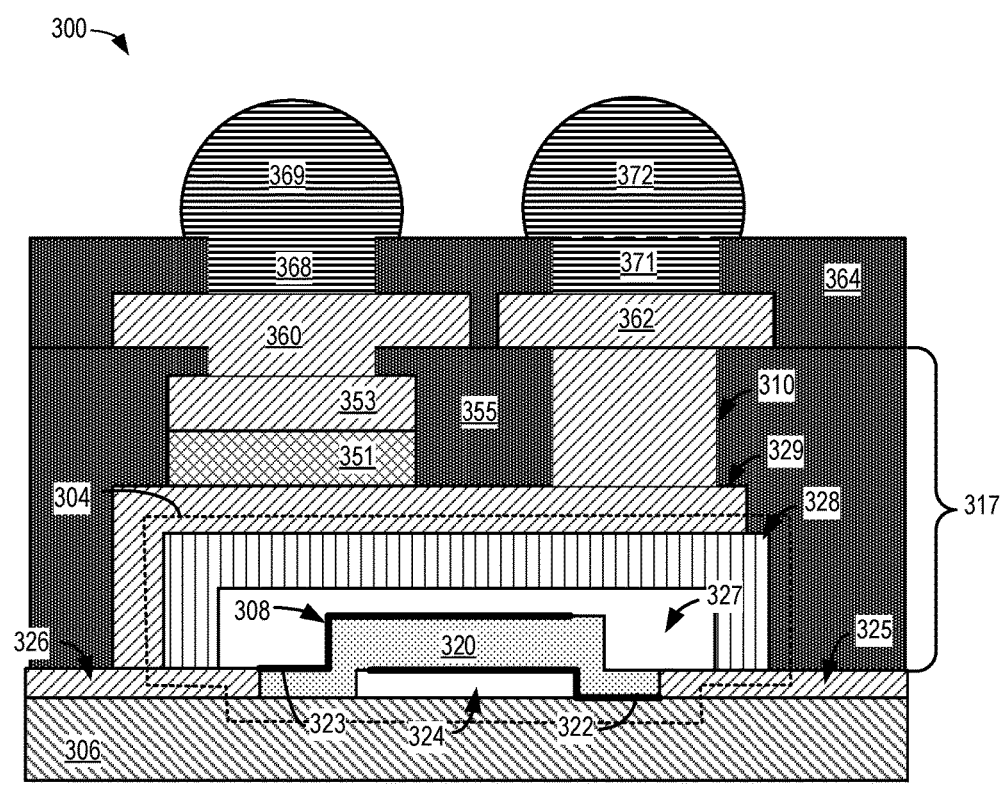
FIG. 3 illustrates an example of a device including an acoustic resonator including a resonator structure embedded within an encapsulating structure, and including an inductor at least partially embedded within the encapsulating structure and electrically connected to the acoustic resonator.

Referring to FIG. 3, a particular illustrative example of a device 300 is shown. The device 300 includes an acoustic resonator (or filter) 304 and at least a portion of an inductor that is electrically connected to the acoustic resonator 304 and that is disposed such that the at least the portion of the inductor is embedded within an encapsulating structure 317 that at least partially encapsulates the acoustic resonator 304. The acoustic resonator 304 may correspond to or may be formed or operate as described above with reference to the acoustic resonator 204 of FIG. 2A. For example, the acoustic resonator 304 may include a resonator structure 308 that corresponds to a piezoelectric layer 320 between an electrode 323 and an electrode 322. The resonator structure 308 may be at least partially surrounded by air-gaps 324 and 327 to confine acoustic waves.

The acoustic resonator 304 may correspond to the acoustic resonator 106 of the first filter 102 of FIG. 1. The acoustic resonator 304 may correspond to or may include a surface acoustic wave (SAW) resonator, a bulk acoustic wave (BAW) resonator, or a thin-film bulk acoustic resonator (FBAR). The acoustic resonator 304 may be formed as described in more detail with reference to FIG. 10. In some examples, the acoustic resonator 304 may correspond to an acoustic filter. Alternatively or additionally, in some examples, the acoustic resonator 304 may be electrically coupled to one or more other acoustic resonators (e.g., in a ladder or lattice configuration) to form an acoustic filter. The device 300 includes a substrate 306. The substrate 306 may be formed of or may include a glass material, a polymer material, or a combination thereof.

The acoustic resonator 304 may include a capping layer 328. The capping layer 328 may correspond to or may be formed as described above with reference to the capping layer 228 of FIG. 2A. For example, the capping layer 328 of FIG. 3 may include or may be formed of silicon, glass, a polymer, or a combination thereof.

The device 300 may include a conductive layer 329 proximate to (e.g., on, above, or over) the capping layer 328. In some examples, the conductive layer 329 may be formed of or may include metal. The device 300 may include a passivation layer 355. The encapsulating structure 317 may include or may correspond to the conductive layer 329, to the passivation layer 355, or to a combination thereof. The passivation layer 355 may be formed of or may include a dielectric material, such as a polyimide.

The device 300 may further include metallization layers 360 and 362. The device 300 may further include a patterned passivation layer 364, a soldering or bond pad 368 electrically connected to the metallization layer 360, a soldering or bond pad 371 electrically connected to the metallization layer 362, solder ball 369 attached to the soldering or bond pad 368, and a solder ball 372 may be attached to the soldering or bond pad 371.

The inductor may correspond to a spiral inductor or a stitched or solenoid-type inductor. The inductor may be electrically connected to the acoustic resonator 304. For example, the inductor may correspond to a spiral inductor that includes a spiral trace (cross-sectionally illustrated as metallization layer 362) and a via 310 that electrically connects the spiral trace to the conductive layer 329, the conductive layer 329 may be electrically connected to an interconnect 326, and the interconnect 326 may be electrically connected to an electrode 323 of the acoustic resonator 304. The via 310 may be formed in a hole of the passivation layer 355. Thus, a portion (e.g., the via 310) of the inductor may be embedded in the encapsulating structure 317 (e.g., embedded in the passivation layer 355 of the encapsulating structure 317).

The device 300 may further include a capacitor, such as a MIM capacitor. At least a portion of the capacitor may be disposed in, or embedded within, the encapsulating structure 317 (e.g., disposed in, or embedded within, the passivation layer 355). For example, the capacitor may include the conductive layer 329 (e.g., a lower plate), a dielectric layer 351, and a conductive layer 353 (e.g., an upper plate). The dielectric layer 351 may be formed of or may include a dielectric material. The conductive layer 353 may be formed of or may include a metal, such as copper (Cu). The conductive layer 329 may electrically connect the capacitor to the acoustic resonator 304. For example, the conductive layer 329 may be electrically connected to the interconnect 326, which may be electrically connected to the electrode 323 of the acoustic resonator 304. Because the capacitor and the inductor are electrically connected to, or formed at least partially of, the conductive layer 329, the capacitor may be electrically connected to the inductor. In some examples, at least a portion of the capacitor, such as the conductive layer 329 (e.g., the lower plate of the capacitor), is disposed on the capping layer 328.

The capacitor and the inductor (e.g., including the metallization layer 362 and/or the via 310), alone or in conjunction with one or more other electrical components (e.g., one or more other capacitors and/or inductors), may function as a passive network, such as a phase shifter. As an example, the metallization layer 362 and the via 310 may, respectively, correspond to a trace and via of the inductor 112 of the second filter 104 of FIG. 1, and the capacitor (including the layers 351, 353, and 360) of FIG. 3 may correspond to the capacitor 114 of the second filter 104 of FIG. 1. For example, the acoustic resonator 304 may be electrically connected to one or more other acoustic resonators to form an acoustic bandpass filter of a duplexer as described above, and the passive network may correspond to a phase shifter coupled to a port of the acoustic bandpass filter.

Thus, the acoustic resonator 304 (e.g., an acoustic filter or a portion thereof) may be disposed in the same chip or die as one or more components (e.g., an inductor) of a passive network (e.g., a second filter) to which the acoustic resonator 304 is electrically coupled. Positioning the acoustic resonator 304 on the same chip or die as the inductor of the passive network may reduce chip area occupied by the acoustic resonator 304 (e.g., acoustic filter) and the one or more components of the passive network as compared to devices in which the acoustic resonator 304 is formed on a different chip than the one or more components of the passive network.

Figure 4:
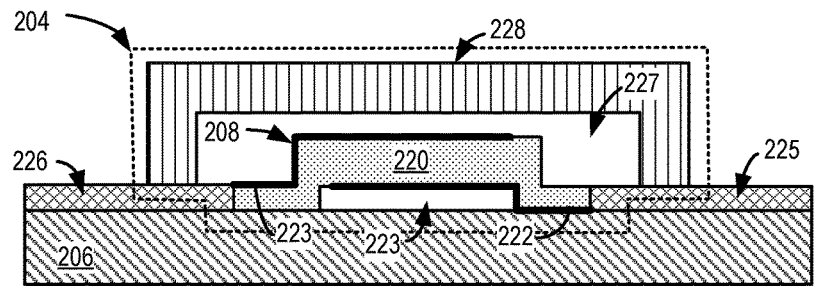
FIG. 4 illustrates an example of a first stage during fabrication of the device of FIG. 2A.

FIG. 4 illustrates an example of a first stage during fabrication of the device 200 of FIG. 2A. The first stage of FIG. 4 may include fabricating the acoustic resonator 204. The acoustic resonator 204 may be fabricated using any resonator fabrication process. In some examples, the acoustic resonator 204 may include or may correspond to an FBAR. In some of these examples, the acoustic resonator 204 may be fabricated using a surface micromachining process that etches a first sacrificial layer [not illustrated] formed on the second substrate 206 to form the air-gap 224. For example, a conductive material may be deposited on the second substrate 206. The conductive material may be etched, thereby separating the interconnect 225 from the interconnect 226. The first sacrificial layer may be formed on a portion of the second substrate 206 at a location corresponding to the location of the air-gap 224. The first sacrificial layer may be formed of a metal or a polymer and may be formed using a sputtering deposition technique. A first metallic layer may be formed and patterned on the first sacrificial layer to create the electrode 222. A piezoelectric material may be formed and patterned to create the piezoelectric layer 220. The piezoelectric layer 220 may be formed using a sputtering deposition technique. A second metallic layer may be formed and patterned on the piezoelectric layer 220 to create the electrode 223. The resonator structure 208 may be formed of or may include the electrodes 222 and 223 and the piezoelectric layer 220. A via may be etched through the resonator structure 208 (e.g., through the electrode 223, the piezoelectric layer 220, and the electrode 222), exposing the first sacrificial layer. The first sacrificial layer may be removed using an etching technique to etch the first sacrificial layer through the via, thereby creating the air-gap 224. A second sacrificial layer [not illustrated] may be deposited on the resonator structure 208. The capping layer 228 may be deposited. A via may be created through the capping layer 228, thereby exposing the second sacrificial layer. The second sacrificial layer may be removed using an etching technique to create the air-gap 227 (or cavity).

Figure 5:
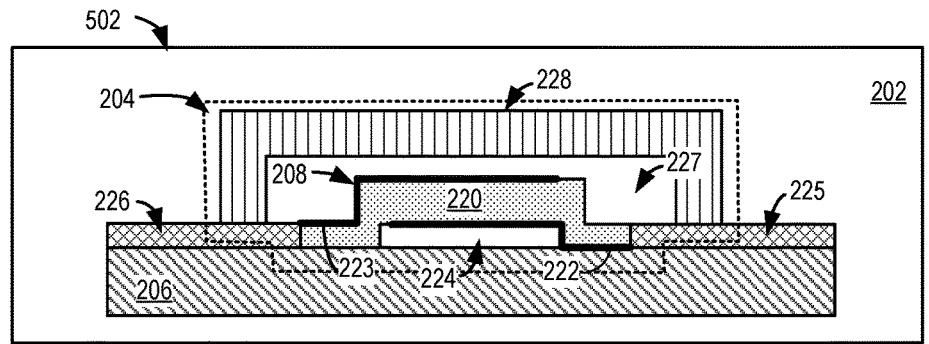
FIG. 5 illustrates an example of a second stage during fabrication of the device of FIG. 2A.

FIG. 5 illustrates an example of a second stage during fabrication of the device 200 of FIG. 2A. The second stage of FIG. 5 may include encapsulating the acoustic resonator 204 in the substrate 202. In some examples, the acoustic resonator 204 may be encapsulated in the substrate 202 using a glass molding process. In some examples, the glass molding process may be performed on a wafer-level or on a die-level.

Figure 6:
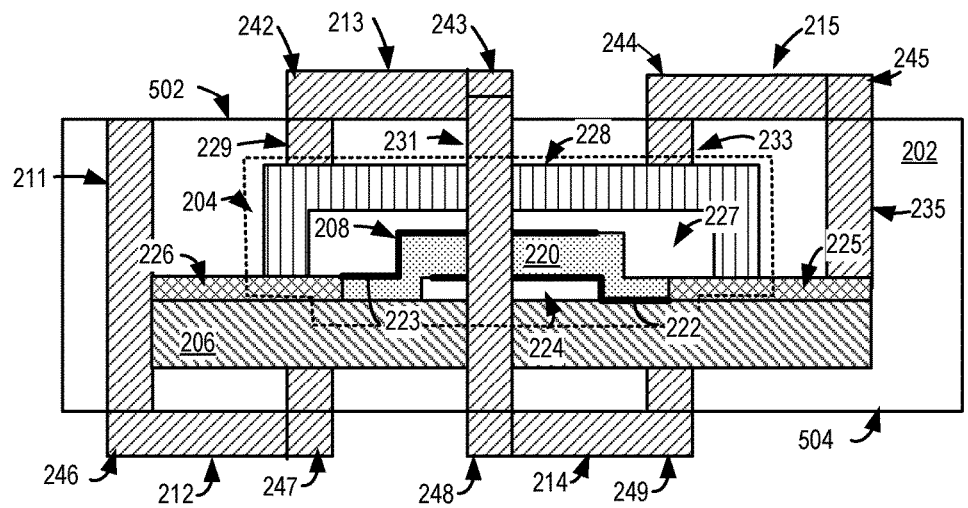
FIG. 6 illustrates an example of a third stage during fabrication of the device of FIG. 2A.

FIG. 6 illustrates an example of a third stage during fabrication of the device 200 of FIG. 2A. The third stage of FIG. 6 may include forming the inductor of FIGS. 2A-2C (illustrated using a top-right to bottom-left diagonal fill pattern) including the vias 211, 229, 231, 233, and 235 and the interconnects 212, 213, 214, and 215.

In some examples, the vias 211, 229, 231, 233, and 235 may be formed using a photolithography technique. For example, the vias 211, 229, 231, 233, and 235 may be formed by forming a first patterned layer (e.g., a photoresist layer) on a surface 502 (e.g., a first surface) of the substrate 202. The first patterned layer may include openings at locations corresponding to the locations of the vias 211, 229, 231, 233, and 235. The substrate 202 may be etched through the openings in the first patterned layer to create openings in and through the substrate 202 at locations corresponding to locations of the vias 211, 229, 231, 233, and 235. Material of the vias 211, 229, 231, 233, and 235 may be deposited into the openings in the substrate 202 to form the vias 211, 229, 231, 233, and 235. The vias 211 and 231 may be disposed in the substrate 202 proximate to a first side of the acoustic resonator 204, and the vias 229 and 233 may be disposed in the substrate 202 proximate to a second side of the acoustic resonator 204. Thus, the vias 211, 229, 231, and 233 may be disposed in the substrate 202 such that the vias 211, 229, 231, and 233 are alternatingly disposed proximate to opposing sides of the acoustic resonator 204. The via 235 may be coupled to the interconnect 225. The first patterned layer may be removed.

A second patterned layer (e.g., a photoresist layer or a hard-mask layer) [not illustrated] may be formed on the surface 502 of the substrate 202. The second patterned layer may include openings (e.g., second openings) at locations corresponding to the locations of the interconnects 213 and 215 (e.g., a plurality of first conductive interconnects), and may expose ends (e.g., first ends) of one or more of the vias 211, 229, 231, 233, and 235 proximate to the surface 502 of the substrate 202. A conductive (e.g., metal) layer (e.g., a first metal layer) may be formed in the second openings (e.g., using an electroplating process). A chemical mechanical planarization (CMP) process may be performed and the second patterned layer may be removed, leaving portions of the first metal layer in the second openings. The portions of the first metal layer in the second openings may correspond to the interconnects 213 and 215. One or more additional layers that are not illustrated, such as an interlayer dielectric layer and a sacrificial layer, may be present around or in between the interconnects 213 and 215 and the substrate 202. The interconnect 213 may include a first end 242 electrically coupled to a first end of the via 229 and may include a second end 243 coupled to a first end of the via 231. The interconnect 215 may include a first end 244 electrically coupled to a first end of the via 233 and may include a second end 245 coupled to a first end of the via 235.

A third patterned layer (e.g., a photoresist layer or a hard-mask layer) [not illustrated] may be formed on the surface 504 of the substrate 202. The third patterned layer may include openings (e.g., third openings) at locations corresponding to the locations of the interconnects 212 and 214 (e.g., a plurality of second conductive interconnects), and may expose ends (e.g., second ends) of one or more of the vias 211, 229, 231, and 233 proximate to the surface 504 of the substrate 202. A conductive (e.g., metal) layer (e.g., a second metal layer) may be formed in the third openings (e.g., using an electroplating process). A CMP process may be performed and the third patterned layer may be removed, leaving portions of the second metal layer in the third openings. The portions of the second metal layer in the third openings may correspond to the interconnects 212 and 214. One or more additional layers that are not illustrated, such as an interlayer dielectric layer and a sacrificial layer, may be present around or in between the interconnects 212 and 214 and the substrate 202. The interconnect 212 may include a first end 246 electrically coupled to a second end of the via 211 and may include a second end 247 coupled to a second end of the via 229. The interconnect 214 may include a first end 248 electrically coupled to a second end of the via 231 and may include a second end 249 coupled to a second end of the via 233.

Thus, the third stage during fabrication of the device 200 of FIG. 2A may include forming the plurality of coils of the inductor of FIGS. 2A, 2B, and 2C around the acoustic resonator 204. Forming the plurality of coils around the acoustic resonator 204 may enable formation of smaller RF circuits.

Figure 7:
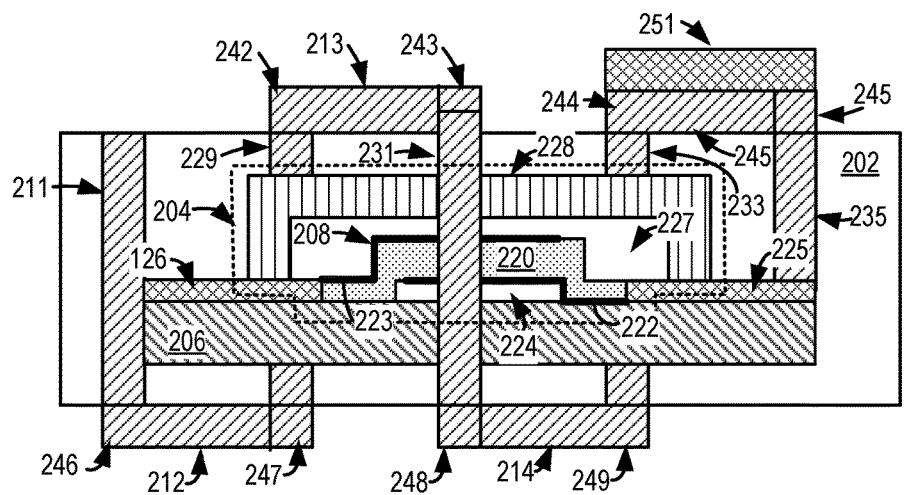
FIG. 7 illustrates an example of a fourth stage during fabrication of the device of FIG. 2A.

FIG. 7 illustrates an example of a fourth stage during fabrication of the device 200 of FIG. 2A. The fourth stage of FIG. 7 may include forming a dielectric layer 251 proximate to the interconnect 215. The dielectric layer 251 may be formed of or may include a dielectric material. The dielectric layer 251 may be formed using a photolithography and deposition process. For example, a dielectric layer may be deposited on the interconnects 213 and 215 and on the surface 402 (of FIG. 5 or 6) of the substrate 202. One or more additional layers that are not illustrated, such as an interlayer dielectric layer and a sacrificial layer, may be present around or in between the dielectric layer 251 and the interconnect 215 of FIG. 7.

Figure 8:
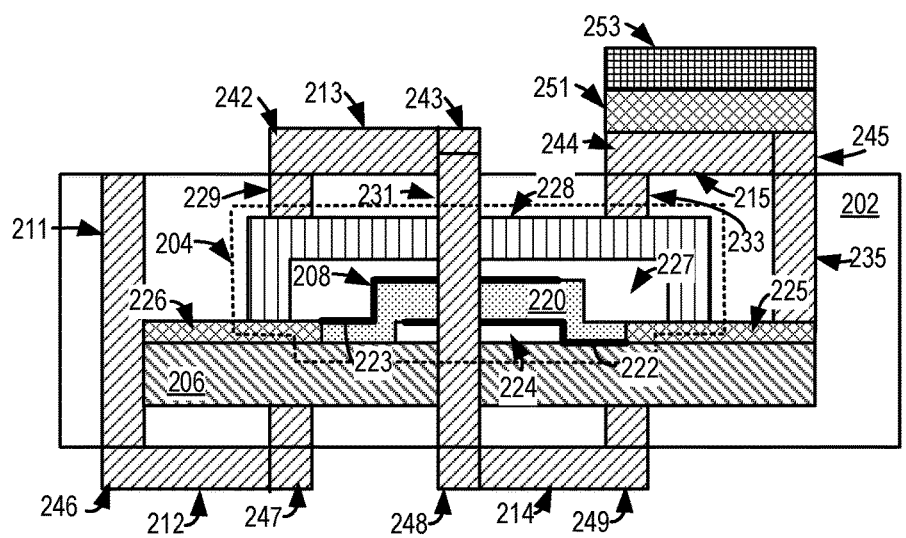
FIG. 8 illustrates an example of a fifth stage during fabrication of the device of FIG. 2A.

FIG. 8 illustrates an example of a fifth stage during fabrication of the device 200 of FIG. 2A. The fifth stage of FIG. 8 may include forming the conductive layer 253 proximate to the dielectric layer 251. The conductive layer 253 may be formed of or may include a metal material, such as copper (Cu). The conductive layer 253 may be formed using an electroplating process. The conductive layer 253 may correspond to a top plate of a MIM capacitor formed of the interconnect 215, the dielectric layer 251, and the conductive layer 253.

Figure 9:
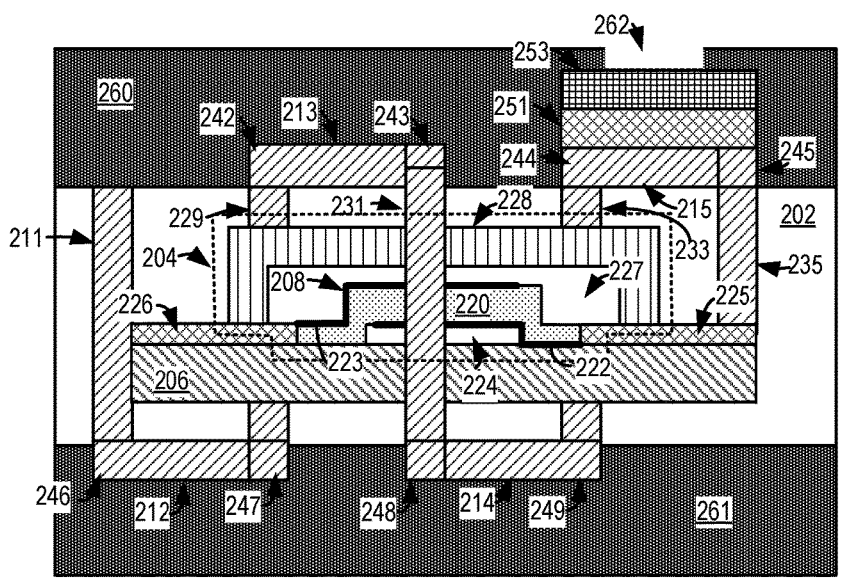
FIG. 9 illustrates an example of a sixth stage during fabrication of the device of FIG. 2A.

FIG. 9 illustrates an example of a sixth stage during fabrication of the device 200 of FIG. 2A. The sixth stage of FIG. 9 may include forming an ILD layer 260 on the surface 502 of FIG. 6 of the substrate 202, the via 211, the interconnect 213, and the conductive layer 253 of FIG. 9. The ILD layer 260 may be formed of or may include one or more dielectric materials. The ILD layer 260 may include a laminate and may be deposited using a lamination process. The sixth stage of FIG. 9 may further include patterning the ILD layer 260 to form an opening 262 that exposes at least a portion of the conductive layer 253. The opening 262 may be formed using a photolithography process or a laser micro-via process. The sixth stage of FIG. 9 may further include forming an ILD layer 261 on the surface 504 of FIG. 6 of the substrate 202 and on the interconnects 212 and 214. The ILD layer 261 of FIG. 9 may be formed of or may include one or more dielectric materials. The ILD layer 261 may include a laminate and may be deposited using a lamination process.

Returning to FIG. 2A, an example of a seventh stage during fabrication of the device 200 is illustrated. The seventh stage of FIG. 2A may include forming metallization layers and attaching a solder ball. For example, the seventh stage of FIG. 2A may include depositing a metal layer on the ILD layer 260 and in the opening 262 and patterning the metal layer using a photolithography process to form the conductive layer 266. A passivation layer 267 may be formed on the ILD layer 260 and the conductive layer 266. An opening may be formed in the passivation layer 267 using a photolithography process or a laser micro-via process. A soldering or bond pad 268 may be formed in the opening formed in the passivation layer 267, and a solder ball 269 may be attached to the soldering or bond pad 268.

Figure 10:
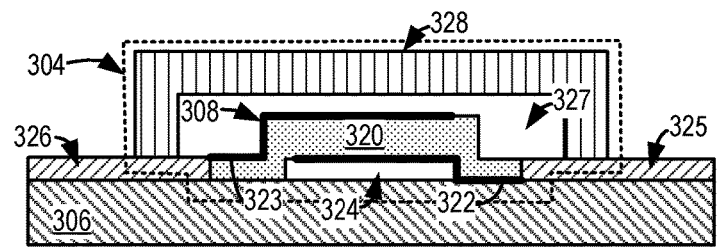
FIG. 10 illustrates an example of a first stage during fabrication of the device of FIG. 3.

FIGS. 10-14 may illustrate stages during fabrication of the device 300 of FIG. 3. FIG. 10 illustrates an example of a first stage during fabrication of the device 200 of FIG. 3. The first stage of FIG. 10 may include fabricating the acoustic resonator 304. The acoustic resonator 304 of FIG. 10 may correspond to or may be formed as described above with reference to the first stage of FIG. 4 of fabricating the device 200 of FIG. 2A. For example, the resonator structure 308 of FIG. 10 may correspond to or may be formed as described above with reference to the resonator structure 208 of FIG. 4, the capping layer 328 of FIG. 10 may correspond to or may be formed as described above with reference to the capping layer 228 of FIG. 4, and the interconnects 326 and 325 of FIG. 10 may correspond to or may be formed as described above with reference to the interconnects 225 and 226 of FIG. 4.

Figure 11:
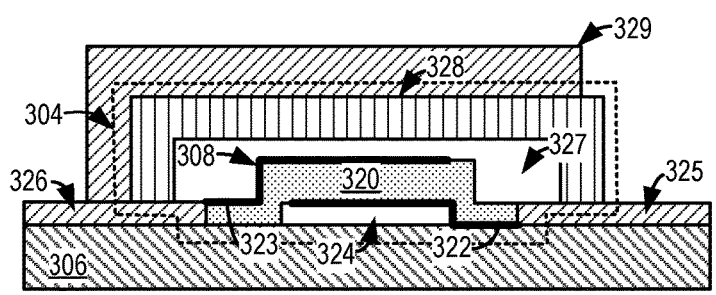
FIG. 11 illustrates an example of a second stage during fabrication of the device of FIG. 3.

FIG. 11 may illustrate an example of a second stage during fabrication of the device 300 of FIG. 3. The second stage of FIG. 11 may include forming the conductive layer 329. The conductive layer 329 may be formed proximate to (e.g., adjacent to, on, above, or over) at least a portion of the capping layer 328. In some examples, the conductive layer 329 is formed of or includes metal, such as copper (Cu). In some examples, the conductive layer 329 is formed using an electroplating technique. In some examples, the conductive layer 329 forms at least a portion of a capacitor and an inductor that is electrically connected (e.g., via the interconnect 326) to the acoustic resonator 304 (e.g., to the electrode 323 of the acoustic resonator 304).

Figure 12:
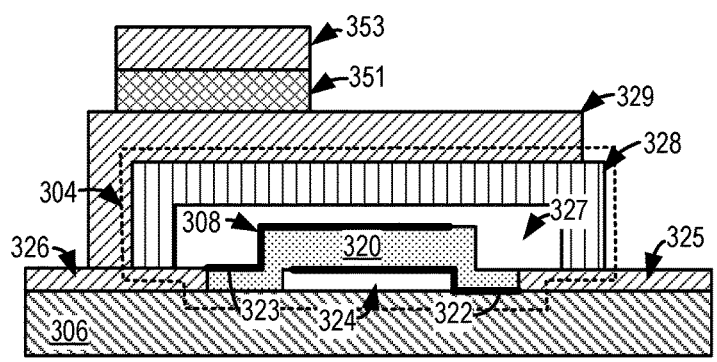
FIG. 12 illustrates an example of a third stage during fabrication of the device of FIG. 3.

FIG. 12 may illustrate an example of a third stage during fabrication of the device 300 of FIG. 3. The third stage of FIG. 12 may include forming remaining layers of a capacitor that includes at least a portion of the conductive layer 329. For example, the third stage of FIG. 12 may include forming the dielectric layer 351 and the conductive layer 353 (e.g., a top plate of a MIM capacitor). The conductive layer 353 may be formed of or may include a metal material, such as copper (Cu). The conductive layer 353 may be formed using an electroplating process.

Figure 13:
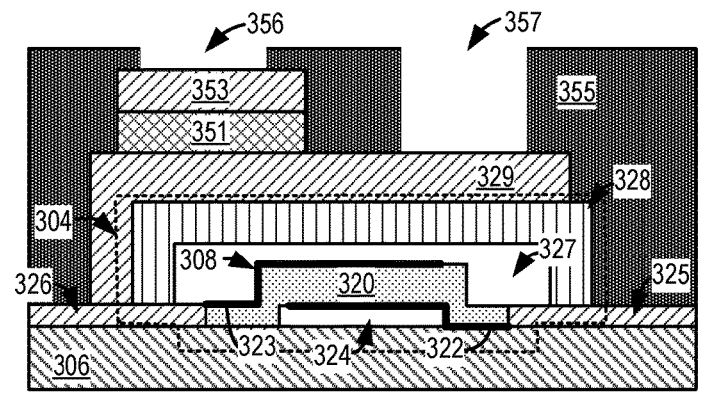
FIG. 13 illustrates an example of a fourth stage during fabrication of the device of FIG. 3.

FIG. 13 may illustrate an example of a fourth stage during fabrication of the device 300 of FIG. 3. The fourth stage of FIG. 13 may include forming a passivation layer 355. The passivation layer 355 may be formed of or may include a dielectric material, such as a polyimide. The passivation layer 355 may be formed by depositing the dielectric material using a deposition technique and patterning the deposited dielectric material to form the openings 356 and 357. The opening 356 may expose at least a portion of the conductive layer 353 and the opening 357 may expose at least a portion of the conductive layer 329. The openings 356 and 357 may be formed using a photolithography process.

Figure 14:
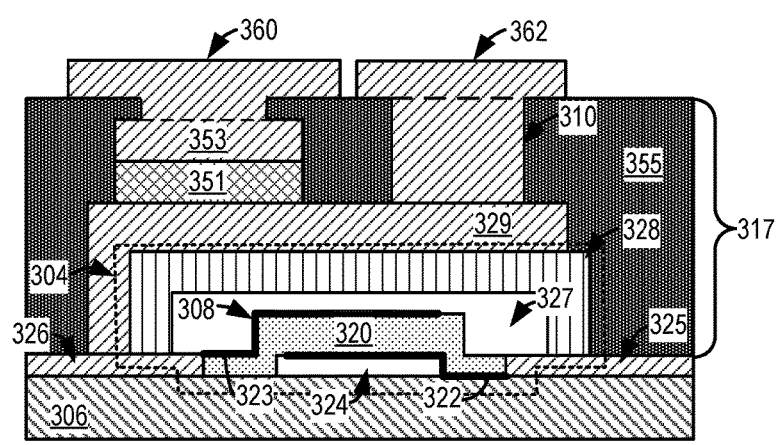
FIG. 14 illustrates an example of a fifth stage during fabrication of the device of FIG. 3.

FIG. 14 may illustrate an example of a fifth stage during fabrication of the device 300 of FIG. 3. The fifth stage of FIG. 14 may include forming the inductor and metallization layers 360 and 362. For example, conductive material may be deposited in the opening 356 and 357 of FIG. 13 to form the via 310, the metallization layer 362, and the metallization layer 360 of FIG. 14.

Returning to FIG. 3, an example of a sixth stage during fabrication of the device 300 is illustrated. In the sixth stage of FIG. 3, a patterned passivation layer 364 may be formed that includes an opening that exposes at least a portion of the metallization layer 360 and that includes an opening that exposes at least a portion of the metallization layer 362. The openings may be formed using a photolithography process or a laser micro-via process. A soldering or bond pad 368 may be formed in the opening that exposes the metallization layer 360 and a soldering or bond pad 371 may be formed in the opening that exposes the metallization layer 362. A solder ball 369 may be attached to the soldering or bond pad 368, and a solder ball 372 may be attached to the soldering or bond pad 371.

Figure 15:
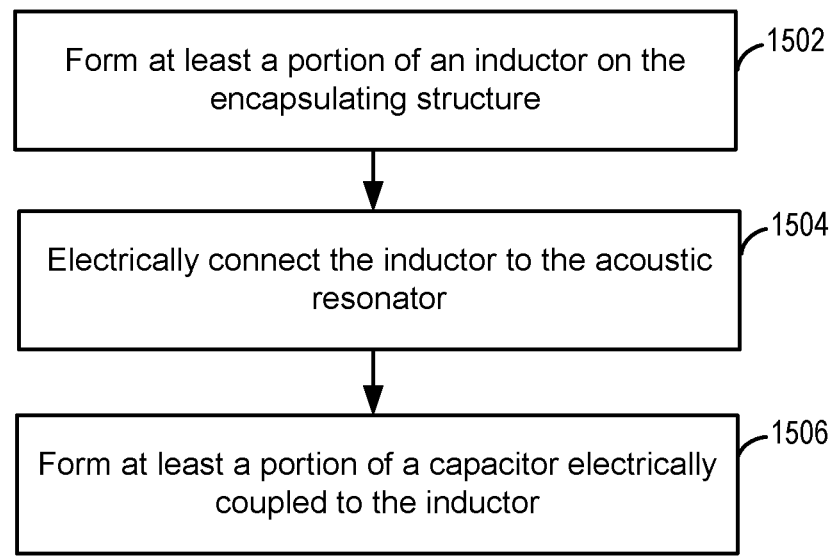
FIG. 15 is a flow chart of an example of a method of forming the device of FIG. 2A.

Referring to FIG. 15, a flow chart of an illustrative example of a method 1500 of fabricating an electronic device is depicted. The electronic device may include the device 200 of FIG. 2A (e.g., formed on the die 103 of FIG. 1), and the method 1500 of FIG. 15 may include the second, third, fourth, fifth, and sixth stages described with reference to FIGS. 5-8, respectively.

The method 1500 of FIG. 15 may include, at 1502, forming at least a portion of an inductor (e.g., a passive component of a passive network) on an encapsulating structure that encloses an acoustic resonator. The acoustic resonator may correspond to the acoustic resonator 204 of FIGS. 2A, 2B, and 2C and the encapsulating structure may correspond to or may include the substrate 202. The encapsulating structure may be formed as described above with reference to the example of a second stage (of FIG. 5) during fabrication of the device 200 of FIG. 2A. The inductor may correspond to the inductor of FIGS. 2A, 2B, and 2C. The at least the portion of the inductor formed on the encapsulating structure may correspond to one or more of the interconnects 212, 213, 214, or 215. The inductor may be formed as described above with reference to the example of a third stage (of FIG. 6) during fabrication of the device 200 of FIG. 2A.

The method 1500 of FIG. 15 may further include, at 1504, electrically connecting the inductor to the acoustic resonator. In some examples, the inductor may be electrically connected to the acoustic resonator by a through via of the inductor. For example, the inductor may be electrically connected to the acoustic resonator 204 of FIGS. 2A, 2B, and 2C by forming the through via 235 such that the through via 235 is electrically coupled to the interconnect 225 (which may be electrically connected to the electrode 222 of the acoustic resonator 204).

The method 1500 of FIG. 15 may further include, at 1506, forming at least a portion of a capacitor electrically coupled to the inductor. The capacitor may include a MIM capacitor. The capacitor may include or may be formed of the interconnect 215, the dielectric layer 251, and the conductive layer 253. The capacitor may be formed as described above with reference to the example fourth and fifth stages (of FIGS. 7 and 8, respectively) during fabrication of the device 200 of FIG. 2A.

Figure 16:
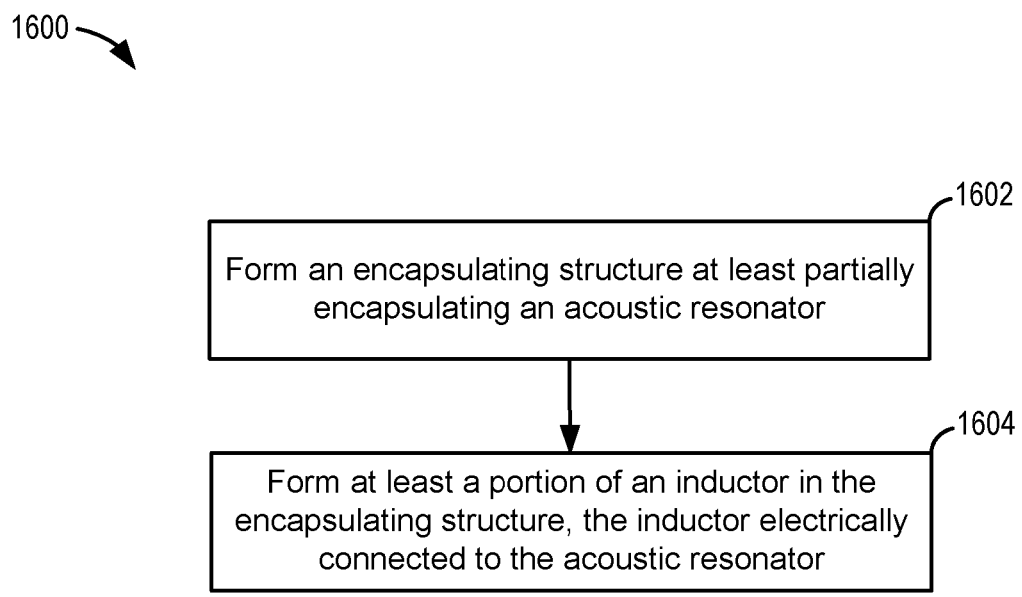
FIG. 16 is a flow chart of an example of a method of forming the device of FIG. 3.

Referring to FIG. 16, a flow chart of an illustrative example of a method 1600 of fabricating an electronic device is depicted. The electronic device may include the device 300 of FIG. 3 (e.g., formed on the die 103 of FIG. 1), and the method 1600 of FIG. 16 may include the first, second, third, fourth, and fifth, stages described with reference to FIGS. 10-14, respectively.

For example, the method 1600 of FIG. 16 may include, at 1602, forming an encapsulating structure at least partially encapsulating an acoustic resonator. The acoustic resonator may correspond to the acoustic resonator 304 of FIG. 3 and the encapsulating structure may correspond to or may include the encapsulating structure 317. The encapsulating structure 317 may include the conductive layer 329, the passivation layer 355 (e.g., prior to patterning the passivation layer 355), or both. The conductive layer 329 and the passivation layer 355 may be formed as described above with reference to the examples of first, second, and fourth stages during fabrication of the device 300 of FIG. 3.

The method 1600 of FIG. 16 may include, at 1604, forming at least a portion of an inductor within the encapsulating structure. For example, the inductor may correspond to the inductor (including the via 310 and the metallization layer 362) described above with reference to FIG. 3 and may be formed as described above with reference to the example of the fifth stage of FIG. 14 during fabrication of the device 300 of FIG. 3. At least a portion (e.g., the via 310) of the inductor may be formed in the passivation layer 355. Thus, at least a portion (e.g., the via 310) of the inductor may be formed in the encapsulating structure.

The inductor may be electrically connected to the acoustic resonator 304 (e.g., by physical connection to the conductive layer 329). At least a portion of the inductor (e.g., the via 310) may be formed on the conductive layer 329 formed on the capping layer 328 of the acoustic resonator 304.

The method 1600 may further include forming a capacitor electrically coupled to the inductor (e.g., electrically coupled to the via 310 of the inductor). The capacitor may include or may correspond to a MIM capacitor and may be formed as described above with reference to the second and third stages (of FIGS. 11 and 12) during fabrication of the device 300 of FIG. 3. For example, forming the capacitor may include forming a dielectric layer 351 on at least a portion of the conductive layer 329 formed on the capping layer 328 of the acoustic resonator 304, and forming a conductive layer 353 on the dielectric layer 351.

Figure 17:
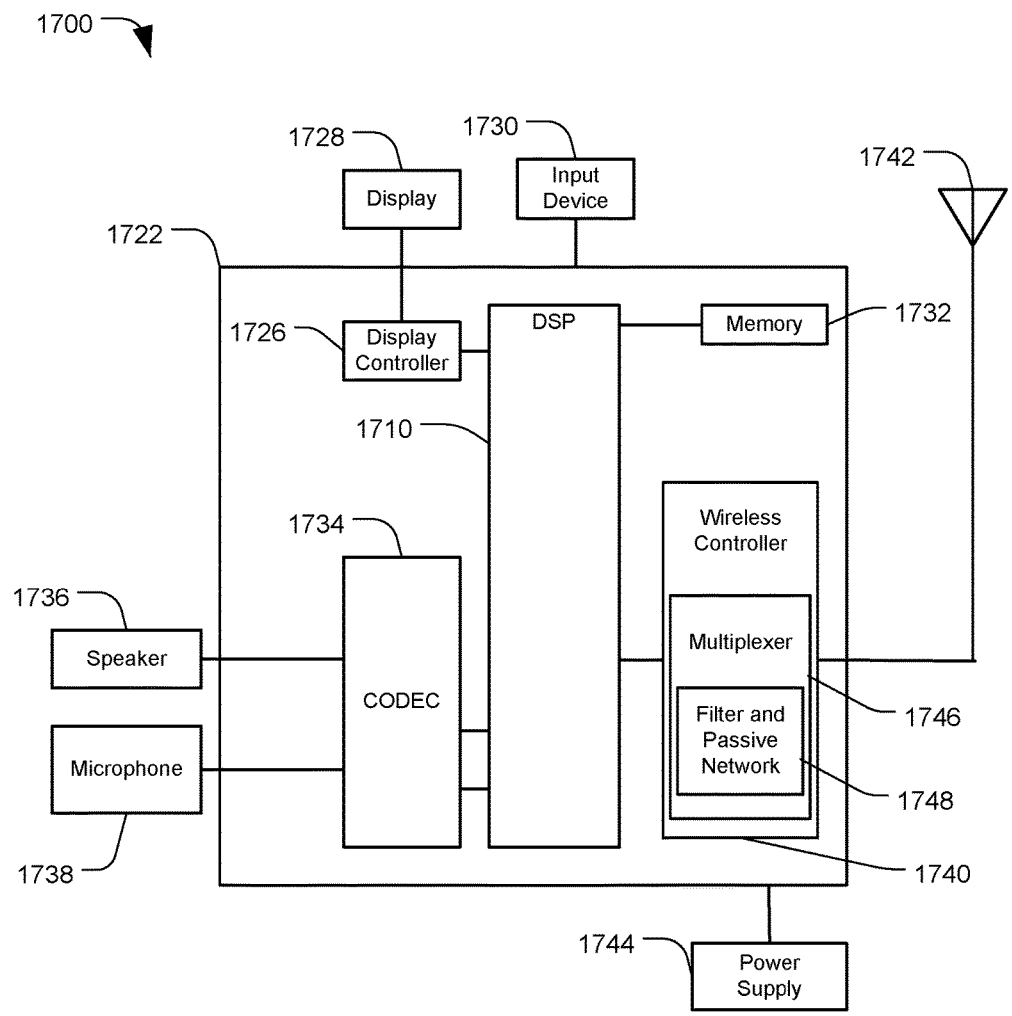
FIG. 17 is a block diagram of a device including an acoustic resonator.

Referring to FIG. 17, a block diagram of a particular illustrative example of a wireless communication device is depicted and generally designated 1700. The wireless communication device 1700 includes a processor 1710, such as a digital signal processor (DSP), coupled to a memory 1732 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art).

FIG. 17 also shows a display controller 1726 that is coupled to the processor 1710 and to a display 1728. A coder/decoder (CODEC) 1734 may also be coupled to the processor 1710. A speaker 1736 and a microphone 1738 may be coupled to the CODEC 1734.

FIG. 17 also indicates that a wireless controller 1740 may be coupled to the processor 1710 and may be further coupled to an antenna 1742. The wireless controller 1740 may include a multiplexer 1746. The multiplexer 1746 may include a filter (e.g., an acoustic filter) and passive network 1748 (e.g., a matching network, a second filter such as an LC filter). The filter and passive network 1748 may include the device 200 of FIG. 2A, the device 300 of FIG. 3, or both, and may be formed on the die 103 of FIG. 1. For example, the acoustic resonator 204 or 304 may, alone or in conjunction with one or more other acoustic resonators, operate as an acoustic filter. As another example, the inductor and capacitor described above with reference to FIG. 2A and the inductor and capacitor described above with reference to FIG. 3 may, alone or in conjunction with one or more other inductors or capacitors, operate as a passive network (of the filter and passive network 1748).

In a particular implementation, the processor 1710, the display controller 1726, the memory 1732, the CODEC 1734, and the wireless controller 1740 are included in a system-in-package or system-on-chip device 1722. In a particular implementation, an input device 1730 and a power supply 1744 are coupled to the system-on-chip device 1722. Moreover, in a particular example, as illustrated in FIG. 17, the display 1728, the input device 1730, the speaker 1736, the microphone 1738, the antenna 1742, and the power supply 1744 are external to the system-on-chip device 1722. However, each of the display 1728, the input device 1730, the speaker 1736, the microphone 1738, the antenna 1742, and the power supply 1744 may be coupled to a component of the system-on-chip device 1722, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices, as described further with reference to FIG. 18.

Figure 18:
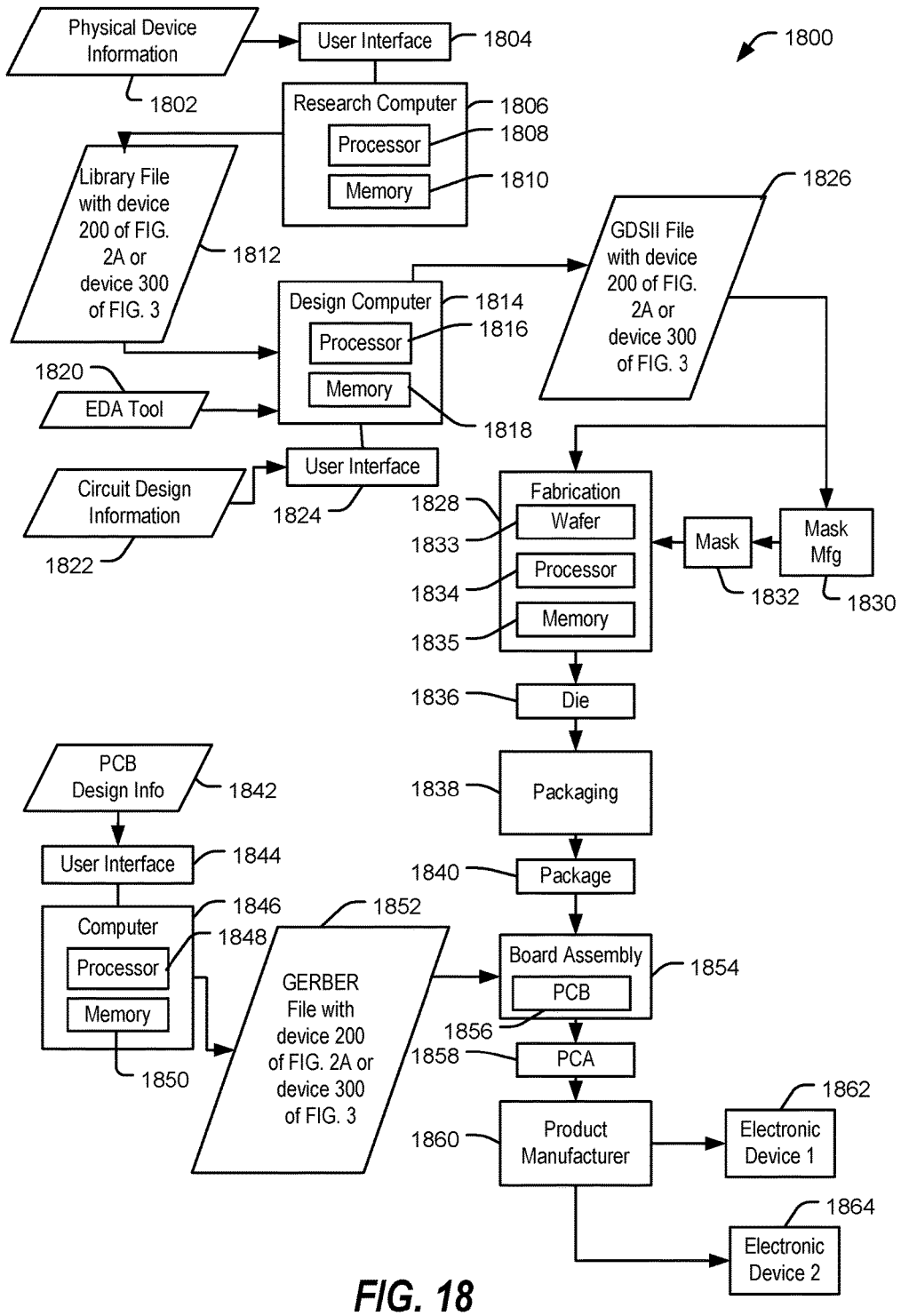
FIG. 18 is a data flow diagram of a particular illustrative example of a manufacturing process to manufacture electronic devices that include an acoustic resonator.

Referring to FIG. 18, a particular illustrative example of an electronic device manufacturing (e.g., fabricating) process is depicted and generally designated 1800. Physical device information 1802 is received at the manufacturing process 1800, such as at a research computer 1806. The physical device information 1802 may include design information representing at least one physical property of a device, such as the acoustic resonator 204 and the inductor of FIG. 2A, the acoustic resonator 304 and the portion (e.g., the via 310 and the metallization layer 362) of the inductor described with reference to FIG. 3, or any combination thereof. For example, the physical device information 1802 may include physical parameters, material characteristics, and structure information that is entered via a user interface 1804 coupled to the research computer 1806. The research computer 1806 includes a processor 1808, such as one or more processing cores, coupled to a computer readable medium (e.g., a non-transitory computer-readable storage medium), such as a memory 1810. The memory 1810 may store computer readable instructions that are executable to cause the processor 1808 to transform the physical device information 1802 to comply with a file format and to generate a library file 1812.

In a particular implementation, the library file 1812 includes at least one data file including the transformed design information. For example, the library file 1812 may include a library of semiconductor devices including a device that includes the acoustic resonator 204 and the inductor of FIG. 2A, the acoustic resonator 304 and the portion (e.g., the via 310 and the metallization layer 362) of the inductor described with reference to FIG. 3, or any combination thereof, that is provided for use with an electronic design automation (EDA) tool 1820.

The library file 1812 may be used in conjunction with the EDA tool 1820 at a design computer 1814 including a processor 1816, such as one or more processing cores, coupled to a memory 1818. The EDA tool 1820 may be stored as processor executable instructions at the memory 1818 to enable a user of the design computer 1814 to design a circuit including the acoustic resonator 204 and the inductor of FIG. 2A, the acoustic resonator 304 and the portion (e.g., the via 310 and the metallization layer 362) of the inductor described with reference to FIG. 3, or any combination thereof, of the library file 1812. For example, a user of the design computer 1814 may enter circuit design information 1822 via a user interface 1824 coupled to the design computer 1814. The circuit design information 1822 may include design information representing at least one physical property of a semiconductor device, such as the acoustic resonator 204 and the inductor of FIG. 2A, the acoustic resonator 304 and the portion (e.g., the via 310 and the metallization layer 362) of the inductor described with reference to FIG. 3, or any combination thereof. To illustrate, the circuit design property may include identification of particular circuits and relationships to other elements in a circuit design, positioning information, feature size information, interconnection information, or other information representing a physical property of a semiconductor device.

The design computer 1814 may be configured to transform the design information, including the circuit design information 1822, to comply with a file format. To illustrate, the file format may include a database binary file format representing planar geometric shapes, text labels, and other information about a circuit layout in a hierarchical format, such as a Graphic Data System (GDSII) file format. The design computer 1814 may be configured to generate a data file including the transformed design information, such as a GDSII file 1826 that includes information describing the acoustic resonator 204 and the inductor of FIG. 2A, the acoustic resonator 304 and the portion (e.g., the via 310 and the metallization layer 362) of the inductor described with reference to FIG. 3, or any combination thereof, in addition to other circuits or information. To illustrate, the data file may include information corresponding to a system-on-chip (SOC) that includes the acoustic resonator 204 and the inductor of FIG. 2A, the acoustic resonator 304 and the portion (e.g., the via 310 and the metallization layer 362) of the inductor described with reference to FIG. 3, and that also includes additional electronic circuits and components within the SOC.

The GDSII file 1826 may be received at a fabrication process 1828 to fabricate the acoustic resonator 204 and the inductor of FIG. 2A, the acoustic resonator 304 and the portion (e.g., the via 310 and the metallization layer 362) of the inductor described with reference to FIG. 3, or any combination thereof, according to transformed information in the GDSII file 1826. For example, a device manufacturing process may include providing the GDSII file 1826 to a mask manufacturer 1830 to create one or more masks, such as masks to be used with photolithography processing, illustrated as a representative mask 1832. The mask 1832 may be used during the fabrication process to generate one or more wafers 1833, which may be tested and separated into dies, such as a representative die 1836. The die 1836 includes a circuit including a device that includes the acoustic resonator 204 and the inductor of FIG. 2A, the acoustic resonator 304 and the portion (e.g., the via 310 and the metallization layer 362) of the inductor described with reference to FIG. 3, or any combination thereof.

For example, the fabrication process 1828 may include a processor 1834 and a memory 1835 to initiate and/or control the fabrication process 1828. The memory 1835 may include executable instructions such as computer-readable instructions or processor-readable instructions. The executable instructions may include one or more instructions that are executable by a computer such as the processor 1834. In a particular implementation, the executable instructions may cause a computer to perform the method 1500 of FIG. 15, the method 1600 of FIG. 16, or at least a portion thereof.

The fabrication process 1828 may be implemented by a fabrication system that is fully automated or partially automated. For example, the fabrication process 1828 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular implementation, the fabrication process 1828 corresponds to a semiconductor manufacturing process associated with a technology node smaller than 14 nm (e.g., 10 nm, 7 nm, etc.). The specific process or combination of processes used to manufacture a device (e.g., including the acoustic resonator 204 and the inductor of FIG. 2A, the acoustic resonator 304 and the portion (e.g., the via 310 and the metallization layer 362) of the inductor described with reference to FIG. 3, or a combination thereof) may be based on design constraints and available materials/equipment. Thus, in particular implementations, different processes may be used than described with reference to FIGS. 1-18 during manufacture of the device.

The fabrication system (e.g., an automated system that performs the fabrication process 1828) may have a distributed architecture (e.g., a hierarchy). For example, the fabrication system may include one or more processors, such as the processor 1834, one or more memories, such as the memory 1835, and/or controllers that are distributed according to the distributed architecture. The distributed architecture may include a high-level processor that controls or initiates operations of one or more low-level systems. For example, a high-level portion of the fabrication process 1828 may include one or more processors, such as the processor 1834, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular implementation, the fabrication system may include multiple processors that are distributed in the fabrication system. For example, a controller of a low-level system component may include a processor, such as the processor 1834.

Alternatively, the processor 1834 may be a part of a high-level system, subsystem, or component of the fabrication system. In another implementation, the processor 1834 includes distributed processing at various levels and components of a fabrication system.

The executable instructions included in the memory 1835 may enable the processor 1834 to form (or initiate formation of) the acoustic resonator 204 and the inductor of FIG. 2A, the acoustic resonator 304 and the portion (e.g., the via 310 and the metallization layer 362) of the inductor described with reference to FIG. 3. In a particular implementation, the memory 1835 is a non-transitory computer-readable medium storing computer-executable instructions that are executable by the processor 1834 to cause the processor 1834 to initiate formation of a device in accordance with at least a portion of the method 1500 of FIG. 15 or at least a portion of the method 1600 of FIG. 16. For example, the computer executable instructions may be executable to cause the processor 1834 to initiate formation of the acoustic resonator 204 and the inductor of FIG. 2A, the acoustic resonator 304 and the portion (e.g., the via 310 and the metallization layer 362) of the inductor described with reference to FIG. 3. As an illustrative example, the processor 1834 may initiate or control one or more steps of the method 1500 of FIG. 15, the method 1600 of FIG. 16, or a portion or combination thereof.

The die 1836 may be provided to a packaging process 1838 where the die 1836 is incorporated into a representative package 1840. For example, the package 1840 may include the single die 1836 or multiple dies, such as a system-in-package (SiP) arrangement. The package 1840 may be configured to conform to one or more standards or specifications, such as Joint Electron Device Engineering Council (JEDEC) standards.

Information regarding the package 1840 may be distributed to various product designers, such as via a component library stored at a computer 1846. The computer 1846 may include a processor 1848, such as one or more processing cores, coupled to a memory 1850. A printed circuit board (PCB) tool may be stored as processor executable instructions at the memory 1850 to process PCB design information 1842 received from a user of the computer 1846 via a user interface 1844. The PCB design information 1842 may include physical positioning information of a packaged semiconductor device on a circuit board, the packaged semiconductor device corresponding to the package 1840 including the acoustic resonator 204 and the inductor of FIG. 2A, the acoustic resonator 304 and the portion (e.g., the via 310 and the metallization layer 362) of the inductor described with reference to FIG. 3, or any combination thereof.

The computer 1846 may be configured to transform the PCB design information 1842 to generate a data file, such as a GERBER file 1852 with data that includes physical positioning information of a packaged semiconductor device on a circuit board, as well as layout of electrical connections such as traces and vias, where the packaged semiconductor device corresponds to the package 1840 including the acoustic resonator 204 and the inductor of FIG. 2A, the acoustic resonator 304 and the portion (e.g., the via 310 and the metallization layer 362) of the inductor described with reference to FIG. 3, or any combination thereof. In other implementations, the data file generated by the transformed PCB design information may have a format other than a GERBER format.

The GERBER file 1852 may be received at a board assembly process 1854 and used to create PCBs, such as a representative PCB 1856, manufactured in accordance with the design information stored within the GERBER file 1852. For example, the GERBER file 1852 may be uploaded to one or more machines to perform various steps of a PCB production process. The PCB 1856 may be populated with electronic components including the package 1840 to form a representative printed circuit assembly (PCA) 1858.

The PCA 1858 may be received at a product manufacturing process 1860 and integrated into one or more electronic devices, such as a first representative electronic device 1862 and a second representative electronic device 1864. For example, the first representative electronic device 1862, the second representative electronic device 1864, or both, may include or correspond to the wireless communication device 1700 of FIG. 17. As an illustrative, non-limiting example, the first representative electronic device 1862, the second representative electronic device 1864, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 1862, the second representative electronic device 1864, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the into which the acoustic resonator 204 and the inductor of FIG. 2A, the acoustic resonator 304 and the portion (e.g., the via 310 and the metallization layer 362) of the inductor described with reference to FIG. 3, or a combination thereof is integrated.

As another illustrative, non-limiting example, one or more of the electronic devices 1862 and 1864 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Aspects, examples, or implementations of the disclosure may be suitably employed in any device which includes active integrated circuitry including memory and on-chip circuitry. For example, one or more of the electronic devices 1862 and 1864 may include cars, trucks, airplanes, boats, other vehicles, or appliances, such as refrigerators, microwaves, washing machines, security systems, other appliances, or a combination thereof. In a particular implementation, one or more of the electronic device 1862 and 1864 may utilize memory and/or wireless communication.

A device that includes the acoustic resonator 204 and the inductor of FIG. 2A, the acoustic resonator 304 and the portion (e.g., the via 310 and the metallization layer 362) of the inductor described with reference to FIG. 3, or any combination thereof, may be fabricated, processed, and incorporated into an electronic device, as described in the illustrative process 1800. One or more aspects of the examples or implementations disclosed with respect to FIGS. 1-17 may be included at various processing stages, such as within the library file 1812, the GDSII file 1826 (e.g., a file having a GDSII format), and the GERBER file 1852 (e.g., a file having a GERBER format), as well as stored at the memory 1810 of the research computer 1806, the memory 1818 of the design computer 1814, the memory 1850 of the computer 1846, the memory of one or more other computers or processors (not shown) used at the various stages, such as at the board assembly process 1854, and also incorporated into one or more other physical implementations such as the mask 1832, the die 1836, the package 1840, the PCA 1858, other products such as prototype circuits or devices (not shown), or any combination thereof. Although various representative stages of production from a physical device design to a final product are depicted, in other implementations fewer stages may be used or additional stages may be included. Similarly, the process 1800 may be performed by a single entity or by one or more entities performing various stages of the process 1800.

Although one or more of FIGS. 1-18 may illustrate systems, devices, and/or methods according to the teachings of the disclosure, the disclosure is not limited to these illustrated systems, devices, and/or methods. Aspects of the disclosure may be suitably employed in any device that includes integrated circuitry including memory, a processor, and on-chip circuitry.

One or more functions or components of any of FIGS. 1-18 as illustrated or described herein may be combined with one or more other portions of another of FIGS. 1-18. Accordingly, no single aspect, example, or implementation described herein should be construed as limiting and aspects, examples, or implementations of the disclosure may be suitably combined without departing form the teachings of the disclosure.

Those of skill would further appreciate that the various illustrative logical blocks, configurations, modules, circuits, and algorithm steps described in connection with the aspects, examples, or implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects, examples, or implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. A storage device is not a signal.

The previous description of the disclosed aspects, examples, or implementations is provided to enable a person skilled in the art to make or use the disclosed aspects, examples, or implementations. Various modifications to these aspects, examples, or implementations will be readily apparent to those skilled in the art, and the principles defined herein may be applied to other aspects, examples, or implementations without departing from the scope of the disclosure. Thus, the present disclosure is not intended to be limited to the aspects, examples, or implementations shown herein but is to be accorded the widest scope possible consistent with the principles and novel features as defined by the following claims.

What is claimed is:

1. A device comprising:
   an acoustic resonator embedded within an encapsulating structure that at least partially encapsulates the acoustic resonator; and
   an inductor electrically connected to the acoustic resonator, the inductor having at least one coil surrounding the acoustic resonator.

2. The device of claim 1, further comprising a capacitor electrically connected to the acoustic resonator.

3. The device of claim 2, wherein the capacitor comprises a metal-insulator-metal (MIM) capacitor including a first metal layer and a second metal layer.

4. The device of claim 3, wherein the inductor includes an interconnect disposed proximate to the encapsulating structure, and wherein the first metal layer of the MIM capacitor includes the interconnect.

5. The device of claim 2, comprising:
   a first filter including the acoustic resonator; and
   a second filter including the capacitor and the inductor.

6. The device of claim 5, wherein the first filter corresponds to an acoustic bandpass filter.

7. The device of claim 1, wherein at least a portion of the inductor is disposed in the encapsulating structure.

8. The device of claim 1, wherein the acoustic resonator corresponds to a surface acoustic wave (SAW) resonator, a bulk acoustic wave (BAW) resonator, or a thin-film bulk acoustic resonator (FBAR).

9. The device of claim 1, wherein the acoustic resonator includes a resonator structure and a capping layer between the resonator structure and the encapsulating structure, the capping layer defining a cavity in which the resonator structure is configured to vibrate.

10. The device of claim 9, wherein the capping layer comprises silicon, and wherein the encapsulating structure comprises glass or a polymer.

11. The device of claim 1, wherein the at least one coil includes four interconnects arranged in a substantially rectangular shape, wherein a first interconnect is disposed on a first surface of the encapsulating structure, wherein a second interconnect is disposed on a second surface of the encapsulating structure, and wherein the first surface is opposite the second surface of the encapsulating structure.

12. The device of claim 1, wherein the at least one coil includes four interconnects arranged in a substantially rectangular shape, wherein a first interconnect comprises a first conductive via extending through the encapsulating structure, wherein a second interconnect comprises a second conductive via extending through the encapsulating structure, and wherein the first and second interconnects are disposed on opposite sides of the acoustic resonator.

13. The device of claim 1, further comprising a communications device, a personal digital assistant (PDA), a mobile phone, a cellular phone, a navigation device, a computer, a portable computer, a desktop computer, a set top box, an entertainment unit, a fixed location data unit, a mobile location data unit, a monitor, a computer monitor, a television, a tuner, a radio, a satellite radio, a music player, a digital music player, a portable music player, a video player, a digital video player, a digital video disc (DVD) player, a portable digital video player, or a combination thereof, in which the acoustic resonator and the inductor are disposed.

14. A device comprising:
    an inductor including a plurality of coils defining an interior region; and
    an acoustic resonator disposed within the interior region of the plurality of coils.

15. The device of claim 14, further comprising a substrate, wherein the acoustic resonator is embedded within the substrate.

16. The device of claim 15, wherein the substrate comprises a glass material, a polymer material, or both.

17. The device of claim 15, wherein at least one coil of the plurality of coils includes four interconnects arranged in a substantially rectangular shape, wherein a first interconnect comprises a first conductive via extending through the substrate, wherein a second interconnect comprises a second conductive via extending through the substrate, and wherein the first and second interconnects are disposed on opposite sides of the acoustic resonator.

18. The device of claim 15, wherein at least one coil of the plurality of coils includes a first conductive interconnect on a first surface of the substrate, a second conductive interconnect on a second surface of the substrate, and at least one conductive via embedded in the substrate.

19. The device of claim 14, wherein the acoustic resonator corresponds to a surface acoustic wave (SAW) resonator, a bulk acoustic wave (BAW) resonator, or a thin-film bulk acoustic resonator (FBAR).

20. The device of claim 14, further comprising an electronic device in which the inductor and the acoustic resonator are disposed.

21. The device of claim 14, further comprising a communications device, a personal digital assistant (PDA), a mobile phone, a cellular phone, a navigation device, a computer, a portable computer, a desktop computer, a set top box, an entertainment unit, a fixed location data unit, a mobile location data unit, a monitor, a computer monitor, a television, a tuner, a radio, a satellite radio, a music player, a digital music player, a portable music player, a video player, a digital video player, a digital video disc (DVD) player, a portable digital video player, or a combination thereof, in which the inductor and the acoustic resonator are disposed.

22. A method of fabricating a device using a glass molding process, the method comprising:
    forming an encapsulating structure to enclose an acoustic resonator in a glass substrate;
    forming at least a portion of an inductor on the encapsulating structure that encloses an acoustic resonator; and
    electrically connecting the inductor to the acoustic resonator.

23. The method of claim 22, further comprising forming a conductive layer on a capping layer, wherein the capping layer is disposed over the acoustic resonator, and wherein the inductor is electrically connected to the conductive layer by at least one conductive via.

24. The method of claim 22, further comprising forming a capacitor electrically coupled to the inductor.

25. The method of claim 24, wherein the capacitor is formed by:
forming a dielectric layer on at least a portion of the inductor; and
forming a conductive layer on the dielectric layer.

26. The method of claim 22, wherein forming at least the portion of the inductor comprises:
forming a plurality of conductive vias through the encapsulating structure;
forming a plurality of first conductive interconnects on a first surface of the encapsulating structure; and
forming a plurality of second conductive interconnects on a second surface of the encapsulating structure, wherein the plurality of conductive vias, the plurality of first conductive interconnects, and the plurality of second conductive interconnects form the inductor.

27. The method of claim 26, wherein the acoustic resonator is electrically connected to the inductor by at least one of the plurality of conductive vias.

28. A method of fabricating a device, the method comprising:
forming an encapsulating structure that at least partially encapsulates an acoustic resonator; and
forming at least one coil of a plurality of coils of an inductor, the at least one coil surrounding the acoustic resonator, the inductor electrically connected to the acoustic resonator.

29. The method of claim 28, wherein the at least one coil includes four interconnects arranged in a substantially rectangular shape, wherein a first interconnect is disposed on a first surface of the encapsulating structure, wherein a second interconnect is disposed on a second surface of the encapsulating structure, and wherein the first surface is opposite the second surface of the encapsulating structure.

30. The method of claim 28, wherein the inductor is formed on a conductive layer, wherein the conductive layer is disposed on a capping layer of the acoustic resonator and further comprising forming a capacitor electrically coupled to the inductor by:
forming a dielectric layer on at least a portion of the conductive layer formed on the capping layer of the acoustic resonator; and
forming a conductive layer on the dielectric layer.

\* \* \* \* \*